United States Patent
Levatich et al.

(10) Patent No.: US 9,972,768 B2
(45) Date of Patent: May 15, 2018

(54) ACTUATOR STRUCTURE AND METHOD

(71) Applicant: Novasentis, Inc., Burlingame, CA (US)

(72) Inventors: Mark Levatich, State College, PA (US); Christophe Ramstein, San Francisco, CA (US); Matthew Douglas Rogge, Petaluma, CA (US); Richard Ducharme, Alexandria, PA (US)

(73) Assignee: Novasentis, Inc., Burlingame, CA (US)

( * ) Notice: Subject to any disclaimer, the term of this patent is extended or adjusted under 35 U.S.C. 154(b) by 639 days.

(21) Appl. No.: 14/461,091

(22) Filed: Aug. 15, 2014

(65) Prior Publication Data

US 2016/0049576 A1    Feb. 18, 2016

(51) Int. Cl.
*H01L 41/04*  (2006.01)
*H01L 41/193*  (2006.01)
(Continued)

(52) U.S. Cl.
CPC .......... *H01L 41/193* (2013.01); *H01L 41/04* (2013.01); *H01L 41/083* (2013.01); *H01L 41/0825* (2013.01); *H01L 41/0926* (2013.01)

(58) Field of Classification Search
CPC .............. H01L 41/083; H01L 41/0926; H01L 41/0825; H01L 41/193; H01L 41/04
(Continued)

(56) References Cited

U.S. PATENT DOCUMENTS 5,263,876 A    11/1993  Johnescu et al.
5,350,966 A    9/1994   Culp
(Continued)

FOREIGN PATENT DOCUMENTS

JP    2010283926 A    12/2010
JP    2011172339 A    9/2011
(Continued)

OTHER PUBLICATIONS

Matysek, Marc et al., "Combined Driving and Sensing Circuitry for Dielectric Elastomer Actuators in mobile applications", Electroactive Polymer Actuators and Devices (EAPAD) 2011, Proc. of SPIE vol. 7976, 797612, 11 pages.
(Continued)

*Primary Examiner* — Derek Rosenau
(74) *Attorney, Agent, or Firm* — Hogan Lovells US LLP

(57) ABSTRACT

An electromechanical polymer (EMP) transducer may include (a) one or more EMP layers each having a first operating characteristic; and (b) one or more EMP layers each having a second operating characteristic different from the first operating characteristic. The EMP transducer may include at least two EMP layers that are activated independently, and one or more EMP layers being configured to be a sensing layer. The sensing layer may sensitive to one or both of the operating characteristics (e.g., temperature, strain, pressure and their respective rates of change). Other operating characteristic may include resin type, modulus, film thicknesses, degrees of deformations, operating temperature ranges, a stretching ratio of the EMP layers, metallization patterns of electrodes, arrangements of active and inactive EMP layers, arrangements of irradiated EMP layers, arrangements of EMP layers acting as sensors, and arrangements of inactive layers of various degrees of stiffness.

29 Claims, 2 Drawing Sheets

(51) Int. Cl.
*H01L 41/083* (2006.01)
*H01L 41/08* (2006.01)
*H01L 41/09* (2006.01)

(58) Field of Classification Search
USPC .................................................. 310/328, 800
See application file for complete search history.

(56) References Cited

U.S. PATENT DOCUMENTS

| | | | |
|---|---|---|---|
| 5,519,278 | A | 5/1996 | Kahn et al. |
| 6,376,971 | B1 | 4/2002 | Pelrine et al. |
| 6,423,412 | B1 | 7/2002 | Zhang et al. |
| 6,605,246 | B2 | 8/2003 | Zhang et al. |
| 6,703,257 | B2 | 3/2004 | Takeuchi et al. |
| 6,787,238 | B2 | 9/2004 | Zhang et al. |
| 6,809,462 | B2 | 10/2004 | Pelrine et al. |
| 6,877,325 | B1 | 4/2005 | Lawless |
| 6,888,291 | B2 | 5/2005 | Arbogast et al. |
| 7,038,357 | B2 | 5/2006 | Goldenberg et al. |
| 7,339,572 | B2 | 3/2008 | Schena |
| 7,368,862 | B2 | 5/2008 | Pelrine et al. |
| 7,446,456 | B2* | 11/2008 | Maruyama ............... G06F 3/011 |
| | | | 310/317 |
| 7,550,189 | B1 | 6/2009 | McKnight et al. |
| 7,567,681 | B2 | 7/2009 | Pelrine et al. |
| 7,944,735 | B2 | 5/2011 | Bertin et al. |
| 7,952,261 | B2 | 5/2011 | Lipton et al. |
| 7,971,850 | B2 | 7/2011 | Heim et al. |
| 8,222,799 | B2 | 7/2012 | Polyakov et al. |
| 8,237,324 | B2 | 8/2012 | Pei et al. |
| 8,362,882 | B2 | 1/2013 | Heubel et al. |
| 8,384,271 | B2 | 2/2013 | Kwon et al. |
| 8,390,594 | B2 | 3/2013 | Modarres et al. |
| 8,427,441 | B2 | 4/2013 | Paleczny et al. |
| 8,450,903 | B2 | 5/2013 | Chen et al. |
| 8,564,181 | B2 | 10/2013 | Choi et al. |
| 8,872,604 | B2* | 10/2014 | Burak ..................... H03H 9/56 |
| | | | 310/324 |
| 9,053,617 | B2 | 6/2015 | Ramstein et al. |
| 9,164,586 | B2 | 10/2015 | Zellers et al. |
| 9,170,650 | B2 | 10/2015 | Ramstein et al. |
| 2005/0145606 | A1 | 7/2005 | Simon |
| 2007/0152974 | A1 | 7/2007 | Kim et al. |
| 2007/0200467 | A1 | 8/2007 | Heydt et al. |
| 2008/0218029 | A1* | 9/2008 | Dollgast ............... H01L 41/273 |
| | | | 310/328 |
| 2008/0284277 | A1 | 11/2008 | Kwon et al. |
| 2009/0002205 | A1 | 1/2009 | Klinghult et al. |
| 2009/0002328 | A1 | 1/2009 | Ullrich et al. |
| 2010/0079264 | A1 | 4/2010 | Hoellwarth |
| 2010/0090813 | A1 | 4/2010 | Je et al. |
| 2010/0316242 | A1 | 12/2010 | Cohen et al. |
| 2011/0038625 | A1 | 2/2011 | Zellers et al. |
| 2011/0116171 | A1* | 5/2011 | Kwon ..................... G02B 3/14 |
| | | | 359/666 |
| 2011/0133598 | A1 | 6/2011 | Jenninger et al. |
| 2011/0290686 | A1 | 12/2011 | Huang |
| 2012/0017703 | A1 | 1/2012 | Ikebe et al. |
| 2012/0105333 | A1 | 5/2012 | Maschmeyer et al. |
| 2012/0121944 | A1 | 5/2012 | Yamamoto et al. |
| 2012/0126663 | A1 | 5/2012 | Jenninger et al. |
| 2012/0126959 | A1 | 5/2012 | Zarrabi et al. |
| 2012/0128960 | A1 | 5/2012 | Busgen et al. |
| 2012/0178880 | A1 | 7/2012 | Zhang et al. |
| 2012/0194448 | A1 | 8/2012 | Rothkopf |
| 2012/0206248 | A1 | 8/2012 | Biggs |
| 2012/0223880 | A1 | 9/2012 | Birnbaum et al. |
| 2013/0207793 | A1 | 8/2013 | Weaber et al. |
| 2014/0035735 | A1 | 2/2014 | Zellers et al. |
| 2014/0085065 | A1 | 3/2014 | Biggs et al. |
| 2014/0090424 | A1 | 4/2014 | Charbonneau et al. |
| 2014/0140551 | A1 | 5/2014 | Ramstein |
| 2014/0191973 | A1 | 7/2014 | Zellers et al. |

FOREIGN PATENT DOCUMENTS

| | | |
|---|---|---|
| JP | 2012134998 A | 7/2012 |
| KR | 20060107259 A | 10/2006 |
| KR | 20110110212 A | 10/2011 |
| KR | 20120013273 A | 2/2012 |
| KR | 20120063318 A | 6/2012 |
| KR | 20120078529 A | 7/2012 |
| KR | 20120105785 A | 9/2012 |
| WO | 2010/085575 A1 | 7/2010 |

OTHER PUBLICATIONS

Neese, Bret et al., "Large Electrocaloric Effect in Ferroelectric Polymers Near Room Temperature", Science vol. 321, Aug. 8, 2008, pp. 821-823.
Zhang Q. M. et al., "Giant Electrostriction and Relaxor Ferroelectric Behavior in Electron-Irradiated Poly(vinylidene fluoride-trifluoroethylene) Copolymer", Science vol. 280, Jun. 26, 1998, pp. 2101-2104.
Xia F. et al., "High Electromechanical Responses in a Poly(vinylidene fluoride-trifluoroethylene-chlorofluoroethylene) Terpolymer", Advanced Materials, vol. 14, Issue 21, Nov. 2002, pp. 1574-1577.
PCT International Search Report and Written Opinion dated Dec. 23, 2013, International Application No. PCT/US2013/053594, 9 pages.
PCT International Search Report and Written Opinion dated Mar. 17, 2014, International Application No. PCT/US2013/071085, 10 pages.
PCT International Search Report and Written Opinion dated Mar. 13, 2014, International Application No. PCT/US2013/071072, 15 pages.
PCT International Search Report and Written Opinion dated Mar. 20, 2014, International Application No. PCT/US2013/071075, 12 pages.
PCT International Search Report and Written Opinion dated Mar. 28, 2014, International Application No. PCT/US2013/071078, 13 pages.
PCT International Search Report and Written Opinion dated Apr. 28, 2014, International Application No. PCT/US2013/071062, 11 pages.
PCT International Preliminary Report on Patentability dated Jun. 4, 2015, International Application No. PCT/US2013/071072, 9 pages.
PCT International Preliminary Report on Patentability dated Jun. 4, 2015, International Application No. PCT/US2013/071075, 9 pages.
PCT International Preliminary Report on Patentability dated Jun. 4, 2015, International Application No. PCT/US2013/071078, 10 pages.
PCT International Preliminary Report on Patentability dated Jun. 4, 2015, International Application No. PCT/US2013/071085, 7 pages.
PCT International Preliminary Report on Patentability dated Jul. 16, 2015, International Application No. PCT/IB2013/003212, 15 pages.
PCT International Written Opinion dated Oct. 15, 2014, International Application No. PCT/IB2013/003212, 20 pages.
PCT International Search Report and Written Opinion dated Feb. 26, 2016, International Application No. PCT/US15/44643, 10 pages.
International Preliminary Report on Patentability for International Application No. PCT/US2015/044643, dated Mar. 2, 2017, 9 pages.

* cited by examiner

ACTUATOR STRUCTURE AND METHOD

BACKGROUND OF THE INVENTION

1. Field of the Invention

The present invention relates to electromechanical polymer (EMP) actuators. In particular, the present invention relates to the structures of EMP actuators and optimization techniques applicable to such EMP actuators.

2. Discussion of the Related Art

An EMP transducer (e.g., any of the transducers disclosed in U.S. patent application publication 2014/0035735) typically includes a multi-layer structure in which multiple layers of EMP films are provided among metalized films. The EMP films in a prior art multi-layer EMP transducer are typically harvested from the same larger EMP film, so that harvested EMP films are identical in dimensions and compositions. The term "transducer" may refer to an actuator, a sensor, or a hybrid structure which may be configured to serve as an actuator, a sensor or both.

SUMMARY

According to one embodiment of the present invention, an electromechanical polymer (EMP) transducer may include (a) one or more EMP layers each having a first operating characteristic; and (b) one or more EMP layers each having a second operating characteristic different from the first operating characteristic. The EMP transducer may include at least two EMP layers that are activated independently, and one or more EMP layers being configured to be a sensing layer. In one embodiment, the sensing layer is sensitive to at least one of the first operating characteristics and the second operating characteristic. Examples of the operating characteristics sensed by the sensing layer include temperature, strain, pressure and their respective rates of change. Examples of the first operating characteristic and the second operating characteristic may include resin type, modulus, film thicknesses, degrees of deformations, operating temperature ranges, a stretching ratio of the EMP layers, metallization patterns of electrodes, arrangements of active and inactive EMP layers, arrangements of irradiated EMP layers, arrangements of EMP layers acting as sensors, and arrangements of inactive layers of various degrees of stiffness.

According to one embodiment of the present invention, the EMP transducer includes EMP layers of overlapping operating temperature ranges.

According to one embodiment of the present invention, the EMP layers of the EMP transducer may be arranged such that EMP layers that are formed out of more elastic material are provided at positions of larger radii of curvature, while more rigid EMP layers are provided at positions of lesser radii of curvature.

According to one embodiment of the present invention, the EMP layers of the EMP transducer are arranged so as to achieve a predetermined bending radius at a predetermined portion of the EMP transducer.

According to one embodiment of the present invention, the EMP layers of the EMP transducer include metallization patterns of electrodes provided on the surfaces of the EMP layers, and selected EMP layers are without metallization, so as to achieve a predetermined overall deformation in the EMP transducer.

According to one embodiment of the present invention, the EMP layers of the EMP transducer have predetermined acoustic properties enabled by provided predetermined thicknesses in selected EMP layers. The selected EMP layers may be formed out of a ter-polymer blend.

According to one embodiment of the present invention, selected EMP layers of the EMP transducer have temperature sensitivity such that the EMP transducer provides a linear mechanical response over a predetermined temperature range.

According to one embodiment of the present invention, selected EMP layers of the EMP transducer have deformation sensitivity and are configured to provide a sensing signal indicative of an amount of deformation in the EMP transducer. The amount of deformation may represent the EMP transducer's position or of device breakdown.

According to one embodiment of the present invention, one or more EMP layers of the EMP transducer is formed out of a heat producing material, such as an electrically resistive material.

According to one embodiment of the present invention, the EMP transducer includes EMP layers providing a first mechanical response in a first direction and a second mechanical response in a second direction. The mechanical responses may include bending or stretching. The directions of the mechanical responses may be offset, for example, by substantially 90°. The EMP layers of the first mechanical response and the EMP layers of the second mechanical response are arranged in an alternating manner in the EMP transducer.

According to one embodiment of the present invention, an EMP bimorph includes: (a) a first EMP transducer having EMP layers configured to provide a first mechanical response in a first direction under control of conductor layers configured in a first conductor pattern; (b) a second EMP transducer configured to provide a second mechanical response in a second direction opposite the first direction under control of conductor layers configured in a second conductor pattern; and (c) a plurality of EMP layers provided between the first EMP transducer and the second EMP transducer, the third EMP layers including a plurality of conductor layers forming a third conductor pattern. The first and second mechanical responses of the EMP bimorph may have different ranges of magnitude (e.g., different bending radius ranges). In one embodiment, the EMP bimorph has at least one of the conductor layers of the third conductor pattern that is thicker than each of the conductor layers of the first and second conductor patterns.

According to one embodiment of the present invention, the EMP bimorph may include a first end and a second end. The EMP bimorph may further include a first connector or tab provided for accessing the conductor layers of the first conductor pattern, a second connector or tab provided for accessing the conductor layers of the second conductor pattern, and a third connector or tab provided for accessing the conductor layers of the third conductor pattern. The first, second and third connectors or tabs may be provided closer to the first end than the second end. A fourth connector may be provided at the second end of the EMP bimorph as an electrical ground terminal.

The present invention is better understood upon consideration of the detailed description below and the accompanying drawings

BRIEF DESCRIPTION OF THE DRAWINGS

FIG. 3 is a cross section of bimorph EMP actuator 300, which includes component EMP actuators 301, 302 and 303, in accordance with one embodiment of the present invention.

DETAILED DESCRIPTION OF THE PREFERRED EMBODIMENTS

The inventors recognize that substantial benefits may be achieved using EMP layers of different operating characteristics in an EMP transducer. For example, one operating parameter for which its value may be varied is the modulus of an EMP layer, which depends on the resin selected to manufacture the EMP films. For example, the ter-polymer poly-(vinylidene fluoride-trifluoroethylene-chlorofluoroethylene) has a higher modulus than the electron-irradiated copolymer poly-(vinylidene fluoride-trifluoroethylene). Other operating parameters whose values may be varied within a multi-layer EMP transducer include EMP film thickness, the stretching ratio of each EMP layer, metallization patterns of metal films acting as electrodes, arrangements of active and inactive EMP layers, arrangements of irradiated EMP layers, arrangements of EMP layers acting as sensors, and arrangements of inactive layers of various degrees of stiffness. To provide customized control of the EMP layers, electrodes providing independent connections to an EMP layer or a group of EMP layers may be provided.

Example 1 (Temperature Stability)

Figure 1:
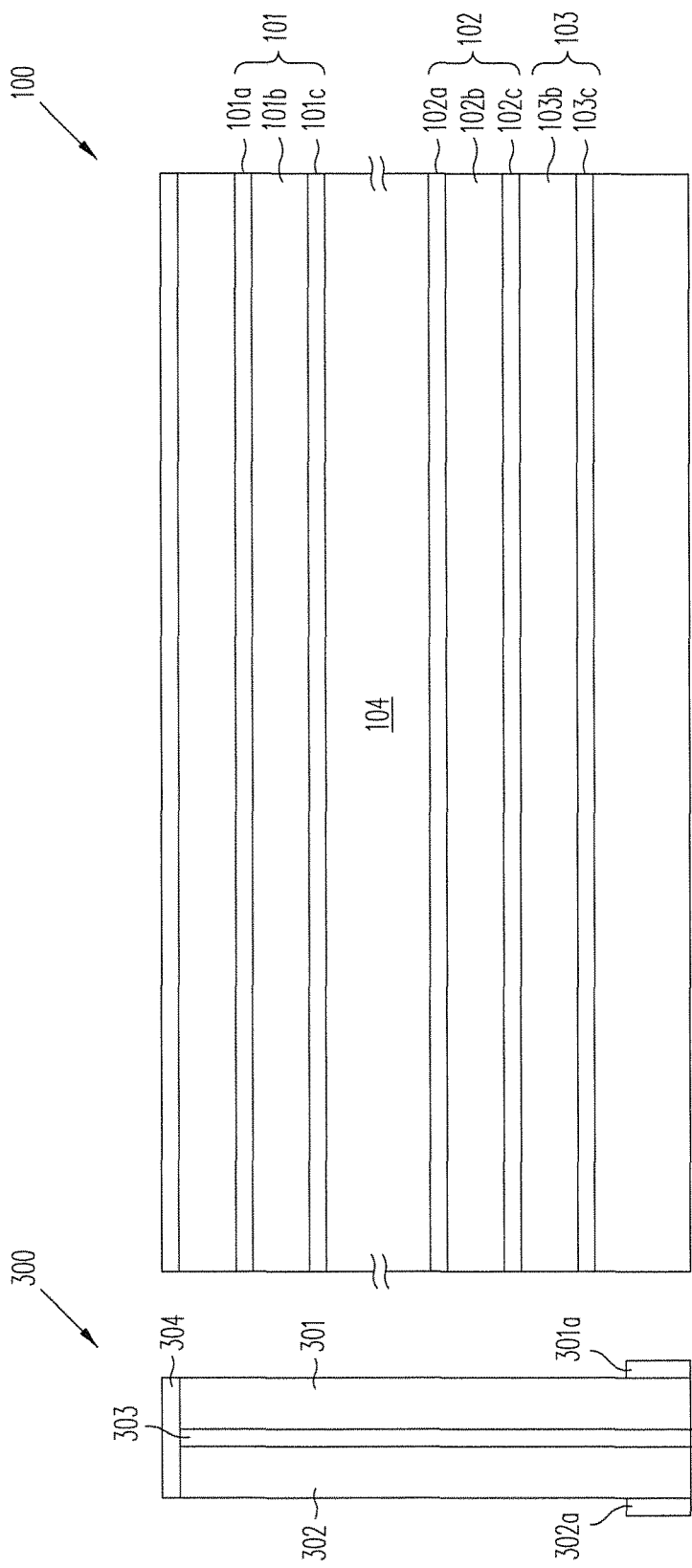
FIG. 1 is a cross section of multi-layer EMP transducer 100, including EMP sensor 101 and EMP actuator layers 102 and 103 having different operating characteristics, in accordance with one embodiment of the present invention.

FIG. 1 is a cross section of multi-layer EMP transducer 100, including EMP sensor 101 and EMP actuator layers 102 and 103 having different operating characteristics, in accordance with one embodiment of the present invention. As shown in FIG. 1, in multi-layer EMP 100, EMP sensor 101 includes one or more EMP layers 101b between conductor layers 101a and 101c. Conductor layers 101a and 101b form electrodes for providing an electrical signal as an output signal of EMP sensor 101. EMP sensor 101 may be, for example, a deformation sensor, a temperature sensor or a pressure sensor. Multi-layer EMP transducer 100 also includes EMP actuators 102 and 103 having different operating characteristics. For example, EMP actuator 102, which includes one or more EMP layers 102b between conductor layers 102a and 102c, may have a first selected operating characteristic (e.g., a first operating temperature range, such as $-20°$ C. to $65°$ C.). EMP actuator 103, shown in FIG. 1 to be adjacent EMP actuator 102, may have EMP layers 103b of a second selected operating characteristic (e.g., a second operating temperature range, such as such as $25°$ C. to $95°$ C.), between conductive layers 102c and 103c. Between EMP sensor 101 and EMP actuator 102 may be numerous active or inactive EMP layers 104 of various operating characteristics, depending on the desired application. Naturally, a multi-layer EMP transducer may include any number of EMP sensors and EMP actuators of different operating characteristics.

Many specific performance requirements may be met by deploying EMP transducers with specifically optimized EMP layers in its construction. For example, one embodiment of the present invention, illustrated above in FIG. 1, achieves operational temperature stability by combining the temperature operating ranges of various EMP layers. An EMP layer's temperature operating range is the range of temperature over which an EMP layer provides favorable performance. Outside of the operating range, the EMP layer's mechanical performance is suboptimal. An EMP layer's temperature operating range is a function of its operating parameters. By providing in a multi-layer EMP actuator two or more EMP layers of different temperature operating ranges, the multilayer EMP actuator can be made to perform over a much wider temperature range than an EMP actuator in which the EMP layers have the same temperature operating range (e.g., $-20°$ C. to $95°$ C.). Such a wide temperature operating range is desirable for typical consumer electronics applications (e.g., cellular telephones). Each EMP layer in a multilayer EMP actuator may be customized for a desired level of performance across the wide temperature range.

Example 2 (Improved Deformation)

EMP transducers may be used in many types of applications. For example, in an EMP force sensor (e.g., a force sensing resistor), a larger deformation typically results from a greater stimulus. However, the actual deformation in a specific EMP force sensor depends on the EMP layers' specific elasticity or modulus. Thus, different deformations may be achieved in different EMP force sensors in response to the same stimulus. In an EMP force sensor, its outer EMP layers (i.e., layers at large radii of curvature) may fail because of the high strain. Thus, in one embodiment of the present invention, an EMP actuator may include one or more EMP layers that are formed out of more elastic material at positions at the larger radii of curvature, while more rigid EMP layers may be provided at positions of lesser radii of curvature. In this manner, an EMP force sensor capable of greater bending without failure may be achieved. By suitably positioning EMP layers of different moduli in an EMP transducer, the deformation characteristics of the EMP transducer may be optimized for a desired application.

Example 3 (Localized Deformation)

The bending radius of an EMP transducer can also be customized by varying the properties of individual EMP layers. Portions of the EMP transducer where low deformation EMP layers are placed may constrain the EMP transducer's overall performance, but may enhance the bending radii in other portions of the EMP transducer. In one embodiment, a local constraint in rigidity is imposed by leaving EMP layers in the EMP transducer without metallization, thereby reducing the overall deformation that would otherwise result. This technique is particularly useful, for example, in creating braille text in medical or consumer electronic devices.

Example 4 (Acoustic Properties)

In some instances, both mechanical performance (e.g., acceleration and deformation) and acoustic properties are required. In one embodiment, an EMP transducer including EMP layers of various EMP materials and various thicknesses provides both desirable acoustic and mechanical properties. Typically, EMP layers formed out of ter-polymer blends have a higher modulus and a faster response.

Example 5 (Temperature Sensing)

In one embodiment, an EMP temperature sensor includes temperature sensing EMP layers of selected temperature sensitive EMP materials. Multiple temperature sensitive EMP layers are required to achieve linearity over a broad temperature range. The EMP temperature sensor may be integrated into an EMP transducer in the manner described above for EMP sensor 101 of FIG. 1.

Example 6 (Calibration)

An EMP actuator may include one or more built-in EMP sensors (e.g., temperature, pressure or strain) formed out of suitable sensing EMP layers. Such a built-in EMP sensor can be used, for example, to monitor the integrity of the EMP transducer. In one embodiment, the rate of change of pressure is monitored.

Example 7 (Calibration)

An EMP actuator may also include one or more deformation sensing layers to provide a feedback signal that indicates the amount of deformation that has occurred within the EMP actuator. The amount of deformation may also be indicative of the device's position or of device breakdown.

Example 8 (Pressure Sensing)

An EMP actuator may also include one or more pressure sensing layers to provide a feedback signal that indicates the amount of pressure that has been applied by the EMP actuator on a work-piece. Pressure-sensing materials are available for creating EMP sensors that are suitable for measuring both a static pressure and a rate of change in pressure. Such actuators are useful in keypads or medical applications.

Example 9 (Heating)

An EMP actuator may also include one or more heat producing layers (e.g., a resistive material) to provide heating of the EMP actuator. A built-in temperature sensor, such as discussed above may provide a feedback signal indicating the temperature of the EMP actuator. Such heat-producing layers may be energized to quickly bring the EMP actuator to its optimal operating temperature prior to operation.

Example 10 (2-Dimensional Structure)

Figure 2:
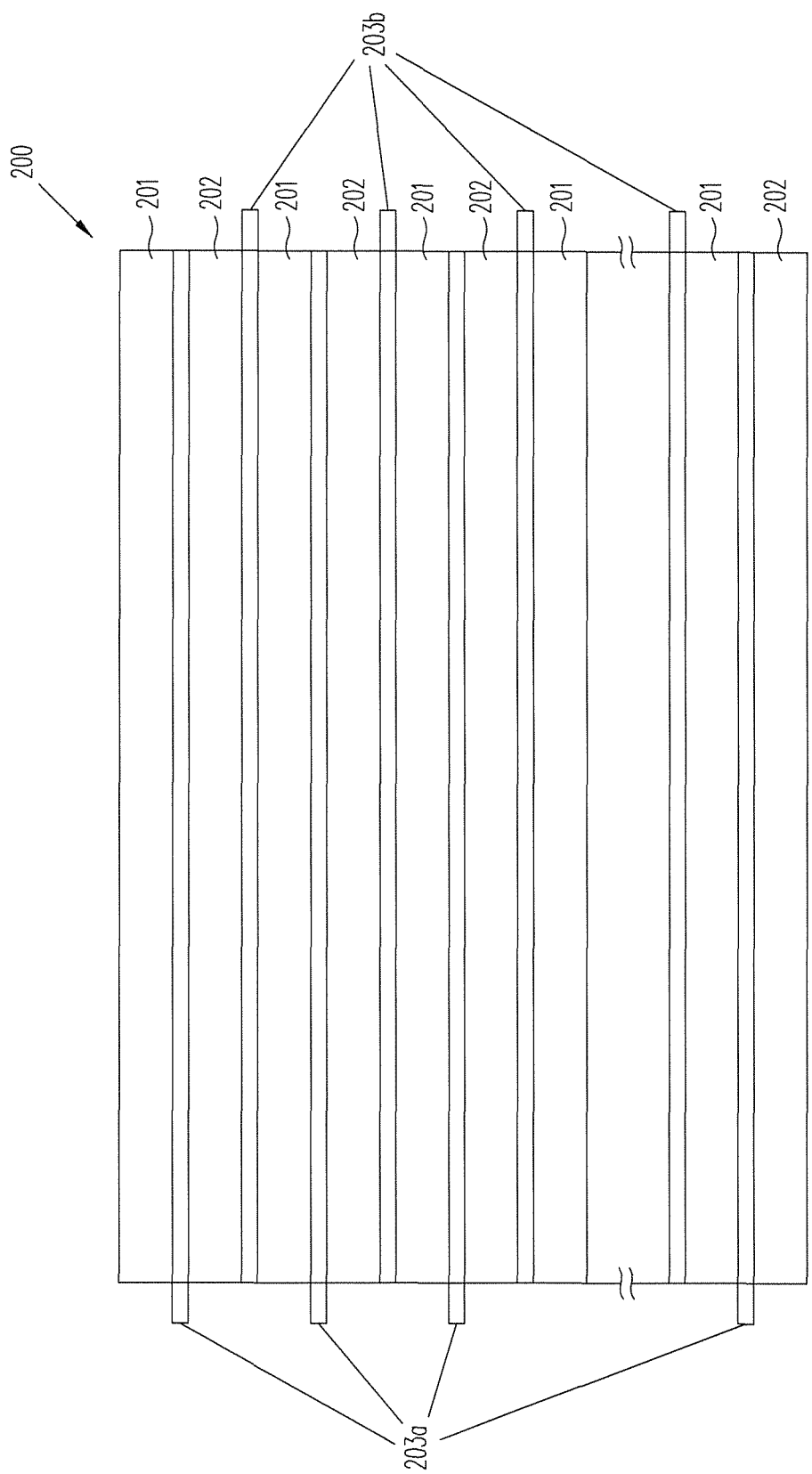
FIG. 2 is a cross section of multi-layer EMP transducer 200, which includes alternating EMP actuator layers 201 and 202 that provide mechanical responses in a first direction and a second direction, respectively, in accordance with one embodiment of the present invention.

FIG. 2 is a cross section of a portion of multi-layer EMP transducer 200, which includes alternating EMP actuator layers 201 and 202 that provide mechanical responses (e.g., bending or stretching) in a first direction and a second direction, respectively, in accordance with one embodiment of the present invention. (In FIG. 2, EMP actuator layers 201 and 202 each include one or more EMP layers between electrode layers, so as to allow them to be independently actuated). As shown in FIG. 2, alternating EMP actuator layers 201 and 202 provide mechanical responses that are orthogonal to each other (i.e., offset by) 90°. During operation, EMP transducer 200 stretches or bends in the first direction when EMP actuator layers 201 are activated and in the second direction when EMP actuator layers 202 are activated. FIG. 2 also shows electrode layers 203a and 203b, with conductive lines being brought out to the sides of a multilayer transducer structure, so as to facilitate external connection to electrode layers 203a and 203b.

Example 11 (Bimorph)

FIG. 3 is a cross section of bimorph EMP actuator 300, which includes component EMP actuators 301, 302 and 303, in accordance with one embodiment of the present invention. As shown in FIG. 3, bimorph EMP actuator 300 is formed by cementing component EMP actuators 301, 302 and 303. EMP actuators 301 and 302 may each be a multi-layer EMP actuator having one or more operating characteristics described above. EMP actuator 303, which is sandwiched between EMP actuators 301 and 302, may include one or more inactive EMP layers together with one or more metallization layers. Connectors or tabs 301a, 302a and 303a are structures of electrical terminals for providing access to the electrode layers of EMP actuators 301, 302 and 303 respectively. Connector 304 provides both structural support for EMP actuators 301, 302 and 303 and a connection to ground for the ground metallization in EMP actuator 303. During operation, activated EMP actuator 301 urges bimorph EMP actuator 300 to bend in one direction, while activated EMP actuator 302 urges bimorph EMP actuator 300 to bend in the opposite direction. Thus, bimorph EMP actuator 300 form a bimorph without requiring a backing layer. The metallization layers of EMP actuator 303 are thicker than other electrode layers, as they are designed to carry all return currents flowing between each of the side tabs 301a and 302a and ground tab 304 without heating. (Heating is expected if all metallization layers are equally thick, as currents in many layers of EMP actuators 301, 302 and 303 converge to the few layers in EMP 303 that are grounded). EMP actuators 301 and 302 need not have the same EMP layers. For example, a preferential bimorph may be formed by having more active EMP layers in one of the EMP actuators 301 and 302 than the other.

The above detailed description is provided to illustrate the specific embodiments of the present invention. Numerous modifications and variations within the scope of the present invention are possible. The present invention is set forth in the accompanying claims.

We claim:

1. An electromechanical polymer (EMP) transducer, comprising:
    an EMP sensor including one or more EMP layers arranged in between EMP conductor layers, the EMP conductor layers forming electrodes;
    a first EMP continuous actuator of a first material type having a first temperature operating range, the first EMP continuous actuator operatively coupled to the electrodes of the EMP sensor, wherein the first EMP continuous actuator includes multiple active and inactive first EMP layers arranged in between first EMP conductor layers; and
    a second EMP continuous actuator of a second material type having a second temperature operating range different from the first temperature operating range, the second EMP continuous actuator arranged underneath and operatively coupled to the first EMP continuous actuator, wherein the second EMP continuous actuator includes multiple active and inactive second EMP layers arranged in between second EMP conductor layers.

2. The EMP transducer of claim 1, wherein at least two of the EMP layers of the EMP sensor, first EMP continuous actuator, or the second EMP continuous actuator are activated independently.

3. The EMP transducer of claim 1, wherein the EMP sensor is sensitive to at least one of the first temperature operating characteristics range and the second temperature operating range.

4. The EMP transducer of claim 1, wherein the EMP sensor is sensitive to an operating characteristic selected from a group consisting of temperature, strain, pressure and their respective rates of change.

5. The EMP transducer of claim 1, wherein the first EMP continuous actuator or the second EMP continuous actuator includes operating characteristics selected from the group consisting of: resin type, modulus of elasticity, film thicknesses, degrees of deformations, operating temperature ranges, a stretching ratio of the EMP layers, metallization patterns of electrodes, arrangements of active and inactive EMP layers, arrangements of irradiated EMP layers, arrangements relative to the EMP sensor layer, and arrangements of inactive layers of various degrees of stiffness.

6. The EMP transducer of claim 1, wherein the first and second temperature operating ranges are overlapping.

7. The EMP transducer of claim 1, wherein the first EMP continuous actuator or the second EMP continuous actuator comprise mechanical moduli, the EMP layers arranged such that EMP layers that are formed out of more elastic material are provided at positions of larger radii of curvature, while more rigid EMP layers are provided at positions of lesser radii of curvature.

8. The EMP transducer of claim 1, wherein the first EMP continuous actuator or the second EMP continuous actuator comprise mechanical moduli, the EMP layers arranged such that EMP layers of the first operating characteristic achieve a predetermined bending radius at a predetermined portion of the EMP transducer.

9. The EMP transducer of claim 1, wherein the first EMP continuous actuator or the second EMP continuous actuator comprise metallization patterns of electrodes provided on the surfaces of the EMP layers, wherein selected EMP layers are without metallization to achieve a predetermined overall deformation in the EMP transducer.

10. The EMP transducer of claim 1, wherein the first EMP continuous actuator or the second EMP continuous actuator comprise acoustic properties, wherein selected EMP layers are provided predetermined thicknesses to achieve predetermined acoustic properties.

11. The EMP transducer of claim 10, wherein the first EMP continuous actuator or the second EMP continuous actuator are formed out of a ter-polymer blend.

12. The EMP transducer of claim 1, wherein the first EMP continuous actuator or the second EMP continuous actuator comprise temperature sensitivity, wherein the EMP layers configured such that the EMP transducer provides a linear mechanical response over a predetermined temperature range.

13. The EMP transducer of claim 1, wherein the first EMP continuous actuator or the second EMP continuous actuator comprise deformation sensitivity, wherein the EMP layers configured to provide a sensing signal indicative of an amount of deformation in the EMP transducer.

14. The EMP transducer of claim 13, wherein the amount of deformation represents the EMP transducer's position or of device breakdown.

15. The EMP transducer of claim 1, further comprising one or more EMP layers formed out of a heat producing material.

16. The EMP transducer of claim 15, wherein the heat producing material is electrically resistive.

17. The EMP transducer of claim 1, wherein the first EMP continuous actuator comprises a first operating characteristic and the second EMP continuous actuator comprises a second operating characteristic, therein the first operating characteristic comprises a first mechanical response in a first direction and the second operating characteristic comprises a second mechanical response in a second direction.

18. The EMP transducer of claim 17, wherein the first mechanical response and the second mechanical response comprise bending or stretching.

19. The EMP transducer of claim 17, wherein the first direction and the second direction are offset by substantially 90°.

20. The EMP transducer of claim 17, wherein the first EMP continuous actuator of the first mechanical response and the EMP layers second EMP continuous actuator of the second mechanical response are arranged in an alternating manner in the EMP transducer.

21. An electromechanical polymer (EMP) bimorph, comprising:
a first EMP transducer of a first material type having EMP layers configured to provide a first mechanical response in a first direction under control of conductor layers configured in a first conductor pattern, the first material type having a first temperature operating range, the first EMP transducer including multiple active and inactive first EMP layers arranged in between first EMP conductor layers;
a second EMP transducer of a second material type arranged underneath the first EMP transducer and configured to provide a second mechanical response in a second direction opposite the first direction under control of conductor layers configured in a second conductor pattern, the second material type having a second temperature operating range different from the first temperature operating range, the second EMP transducer including multiple active and inactive second EMP layers arranged in between second EMP conductor layers; and
a plurality of intermediate EMP layers provided between the first EMP transducer and the second EMP transducer, the plurality of intermediate EMP layers including conductor layers forming a third conductor pattern to operatively couple to the first conductor pattern and the second conductor pattern.

22. The EMP bimorph of claim 21, wherein the first and second EMP transducers are activated independently.

23. The EMP bimorph of claim 21, wherein the first EMP transducer and the second EMP transducer each further comprise one or more EMP layers each being configured to be a sensing layer.

24. The EMP bimorph of claim 23, wherein the sensing layer is sensitive to at least either the first operating characteristics or the second operating characteristics.

25. The EMP bimorph of claim 21, wherein the first operating characteristics and the second operating characteristic are each selected from the group consisting of: resin type, modulus of elasticity, film thicknesses, degrees of deformations, operating temperature ranges, a stretching ratio of the EMP layers, metallization patterns of electrodes, arrangements of active and inactive EMP layers, arrangements of irradiated EMP layers, arrangements of EMP layers acting as sensors, and arrangements of inactive layers of various degrees of stiffness.

26. The EMP bimorph of claim 21, wherein the first mechanical response and the second mechanical response have different predetermined bending radius ranges.

27. The EMP bimorph of claim 21, wherein at least one of the conductor layers of the third conductor pattern is thicker than each of the conductor layers of the first and second conductor patterns.

28. The EMP bimorph of claim 21, wherein the EMP bimorph comprises a first end and a second end, and wherein the EMP bimorph further comprises a first connector or tab provided for accessing the conductor layers of the first conductor pattern, a second connector or tab provided for accessing the conductor layers of the second conductor pattern, and a third connector or tab provided for accessing the conductor layers of the third conductor pattern, the first, second and third connectors or tabs being provided closer to the first end than the second end.

29. The EMP bimorph of claim 28, further comprising a fourth connector provided at the second end of the EMP bimorph, the fourth connector being provided as an electrical ground terminal.

\* \* \* \* \*

UNITED STATES PATENT AND TRADEMARK OFFICE
CERTIFICATE OF CORRECTION

PATENT NO. : 9,972,768 B2
APPLICATION NO. : 14/461091
DATED : May 15, 2018
INVENTOR(S) : Mark Levatich et al.

Page 1 of 1

It is certified that error appears in the above-identified patent and that said Letters Patent is hereby corrected as shown below:

In the Claims

Column 6, Claim 3, Line 64, after "operating", before "range", remove "characteristics"
Column 8, Claim 20, Line 9, after "the", before "second", remove "EMP layers"

Signed and Sealed this
Sixth Day of November, 2018

Andrei Iancu
*Director of the United States Patent and Trademark Office*